(12) United States Patent
Sanduleanu et al.

(10) Patent No.: US 7,466,785 B2
(45) Date of Patent: Dec. 16, 2008

(54) PLL WITH BALANCED QUADRICORRELATOR

(75) Inventors: Mihai Adrian Tiberiu Sanduleanu, Eindhoven (NL); Dominicus Martinus Wilhelmus Leenaerts, Eindhoven (NL)

(73) Assignee: NXP B.V., Eindhoven (NL)

( * ) Notice: Subject to any disclaimer, the term of this patent is extended or adjusted under 35 U.S.C. 154(b) by 527 days.

(21) Appl. No.: 10/533,507

(22) PCT Filed: Oct. 8, 2003

(86) PCT No.: PCT/IB03/04467

§ 371 (c)(1),
(2), (4) Date: May 2, 2005

(87) PCT Pub. No.: WO2004/042925

PCT Pub. Date: May 21, 2004

(65) Prior Publication Data

US 2006/0034410 A1    Feb. 16, 2006

(30) Foreign Application Priority Data

Nov. 5, 2002   (EP)   .................................. 02079608

(51) Int. Cl.
*H03D 3/24*    (2006.01)

(52) U.S. Cl. ........................ 375/375; 375/371; 375/373; 375/374; 375/376

(58) Field of Classification Search ................. 331/1 A, 331/25; 375/374–376, 354, 362, 371; 329/304, 329/306–307, 315, 323, 325
See application file for complete search history.

(56) References Cited

U.S. PATENT DOCUMENTS 6,853,696 B1 * 2/2005 Moser et al. ................. 375/375
2002/0085657 A1 7/2002 Boerstler

OTHER PUBLICATIONS

J. Savoj, et. al. Design of Half-Rate Clock and Data Recovery Circuits fro Optical Communication Systems; vol. CONF. 38, Jun. 2001; pp. 121-126 USA.
Chan Geun Yoon et. al.; Digital Logic Implementation of the Quadricorrelators for Frequency Detector; vol. 2 SYMP 37, Aug. 1994; pp. 757-760.

* cited by examiner

*Primary Examiner*—Shuwang Liu
*Assistant Examiner*—James M Perez

(57) ABSTRACT

A Phase Locked Loop (1) comprising a frequency detector (10) including a balanced quadricorrelator (2), the loop (1) being characterized in that the quadricorrelator (2) comprises double edge clocked bi-stable circuits (21, 22, 23, 24, 25, 26, 27, 28) coupled to multiplexers (31, 32, 33, 34) being controlled by a signal having the same bitrate as the incoming D signal (D).

5 Claims, 3 Drawing Sheets

PLL WITH BALANCED QUADRICORRELATOR

The invention relates to a Phase Locked Loop (PLL) comprising a frequency detector including a balanced quadricorrelator.

PLL circuits are widely used in modern communication circuits for tuning receivers. Normally a PLL comprises a voltage-controlled oscillator (VCO), a frequency control loop and a phase control loop including a frequency detector and a phase detector, respectively. When the incoming signal in the PLL is a high-speed Non Return to Zero (NRZ) random signal, phase detectors and frequency detectors have the difficult task to work on random transitions of the incoming signal. Between transitions the phase and frequency detectors should maintain the phase error and frequency error information such that the voltage controlled oscillator is not pulled away from lock when transitions are missing.

Figure 1:
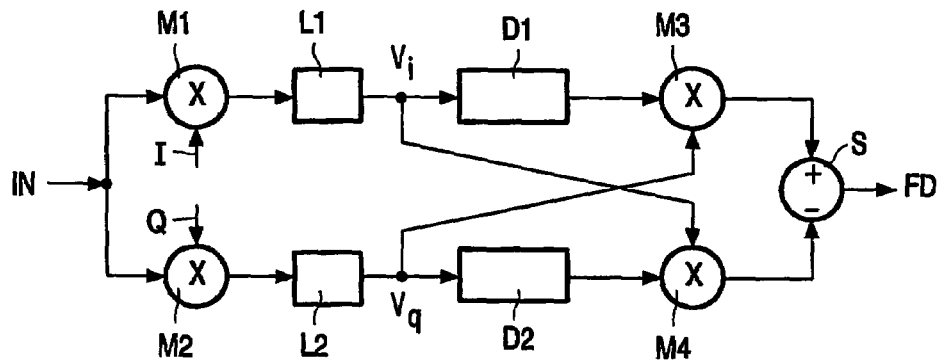

A known implementation of the frequency detector is the quadricorrelator concept as in "Digital Logic Implementation of Quadricorrelators for Frequency detectors", by C. G. Yoon, S. Y. Lee and C. W. Lee, IEEE Proc. of 37.sup.th MidWest Symposium on Circuits and Systems, 1994, pp. 757-760. A model for a balanced digital quadricorrelator is a balanced analog quadricorrelator as shown in FIG. 1. The analog quadricorrelator comprises a first pair of mixers M1, M2 supplied by quadrature signals I, Q and input signal IN. Outputs of said pair of mixers M1, M2 are coupled to a pair of low-pass filters L1, L2, the filters providing signals Vi and Vq, respectively. The signals Vi and Vq are inputted to a pair of derivation circuits D1, D2 coupled to a second pair of mixers M3, M4 and crossed-inputted to the second pair of mixers M3, M4. Signals provided by the second pair of mixers are inputted to an adder S. The adder S provides a signal FD, which is indicative for a frequency error between the input signal IN and quadrature signals I, Q. In the above-mentioned document is presented a digital implementation of the analog balanced quadricorrelator. The digital implementation comprises single edge flip-flops coupled to a combinatorial network. Hence the flip-flops detects only phase shifts between quadrature inputs and a rising edge of the D input signal, which means that this quadricorrelator works at half rate or 2*Tbit. Tbit is defined as the time period for a high or a low binary level. Furthermore, the combinatorial part of the quadricorrelator comprises eight 3-input AND gates and two 4-input OR gates determining delays and supplementary phase-shifts between the signals provided by the quadricorrelator determined by technological errors in matching components.

It is therefore an object of this invention to overcome the above mentioned problems.

In accordance with the invention this is achieved in a device as described in the first paragraph being characterized in that the quadricorrelator comprises double edge clocked bi-stable circuits coupled to multiplexers being controlled by a signal having the same bitrate as the incoming signal. Bi-stable circuits normally read the binary information either on a rising or a falling edge of a clock signal. In terms of the above-mentioned parameter Tbit the input information is read once every period of the clock signal i.e. at every 2Tbit or half rate. Another possibility is reading the input information on both the rising and falling edges of the clock signal, meaning that the input information is read every half period of the clock i.e. at Tbit rate. This feature could be implemented either having a direct coupling between the clock signal and bi-stable circuits or using intermediate signals obtained during processing input signal having the same Tbit. This means that bi-stable circuits could be combined with combinatorial circuits having a control input e.g. multiplexers for working at Tbit speed.

In an embodiment of the invention a first pair of double edge clocked bi-stable coupled to a first multiplexer and a second pair of double edge clocked bi-stable coupled to a second multiplexer are supplied by mutually quadrature phase shifted signals respectively. The first multiplexer and the second multiplexer provide a first signal and a second signal indicative for a phase difference between the incoming signal and mutually quadrature phase shifted signals. The mutually quadrature phase shifted signals are generated by a voltage controlled oscillator. In many applications such as optical networking, a clock recovery is necessary especially when the clock information in missing from the input signal as in Non Return to Zero (NRZ) signals. Furthermore, clock recovery circuits use normally a PLL, the PLL having a quadrature voltage-controlled oscillator providing quadrature signals i.e. mutually shifted with 45 degrees. PLLs also have a phase detector and a frequency detector. The outputs of the multiplexers are updated only on the transitions of the incoming signal maintaining the same error at the output between transitions. The phase difference between the incoming signal and quadrature clock signals is transformed in a positive or negative quantified signal. When this signal is positive the clock increases its phase and for negative signals, the clock decreases its phase.

In another embodiment of the invention a third pair of double edge clock bi-stable coupled to a third multiplexer and a fourth pair of double edge clock bi-stable coupled to a fourth multiplexer are crossed supplied by the first signal and the second signal i.e. the first signal is inputted to the fourth pair of bi-stable circuits and the second signal is inputted to the third pair of bi-stable circuits, the first signal being the clock signal for the third pair of bi-stable circuits and control signal for the third multiplexer, the second signal being the clock signal for the fourth pair of bi-stable circuits and control signal for the fourth multiplexer. The third and fourth pairs of bi-stable circuits are sampled on the transitions of the first and the second signals provided by the first and the second multiplexers. The third and fourth pairs of bi-stables implement a sign inversion of the first and second signals values respectively. The inversion is needed to duplicate the working principle of a differentiator, which provides positive values on rising edges and negative values on the falling edges. It is possible to build the quadricorrelator without inversion but in this case the gain of the frequency detector decreases accordingly because only one edge is used for comparison. The signals generated by the third and fourth multiplexers are inputted to an adder, the adder providing an error signal that is indicative for a frequency error between the incoming signal and mutually quadrature signals. The adder could be a voltage adder when the signals provided by the third and fourth multiplexers are voltages or a simple node when the respective signals are currents.

Figure 2:
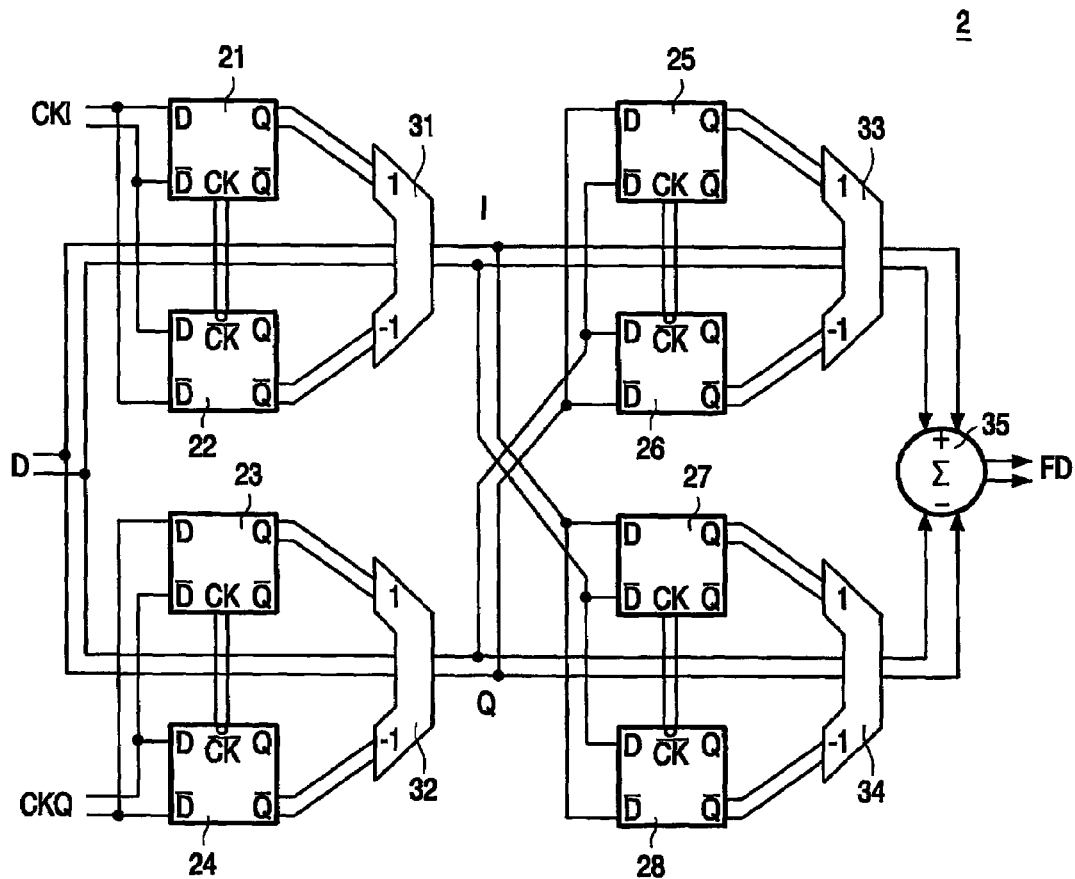
Figure 3:
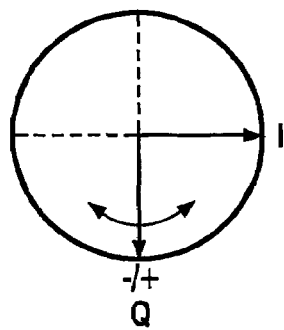
Figure 4:
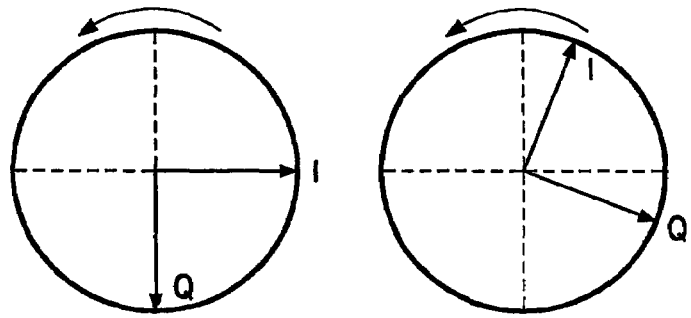
Figure 4:
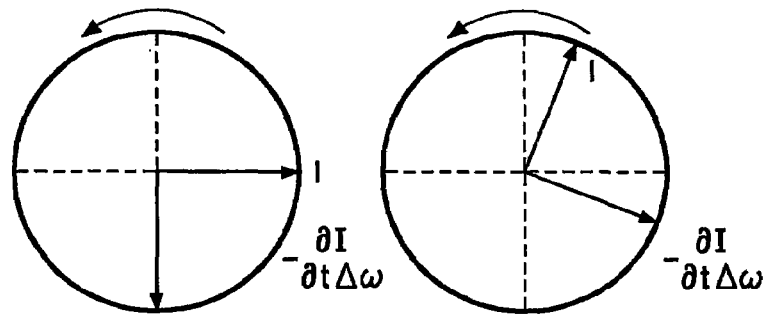
Figure 5:
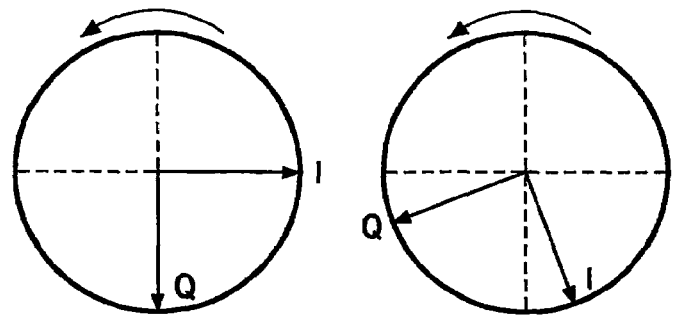
Figure 5:
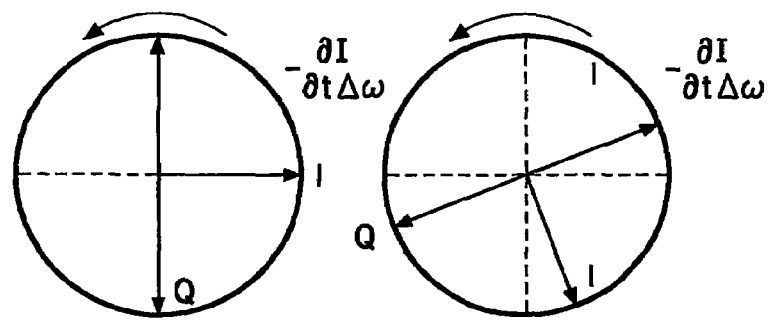
Figure 6:
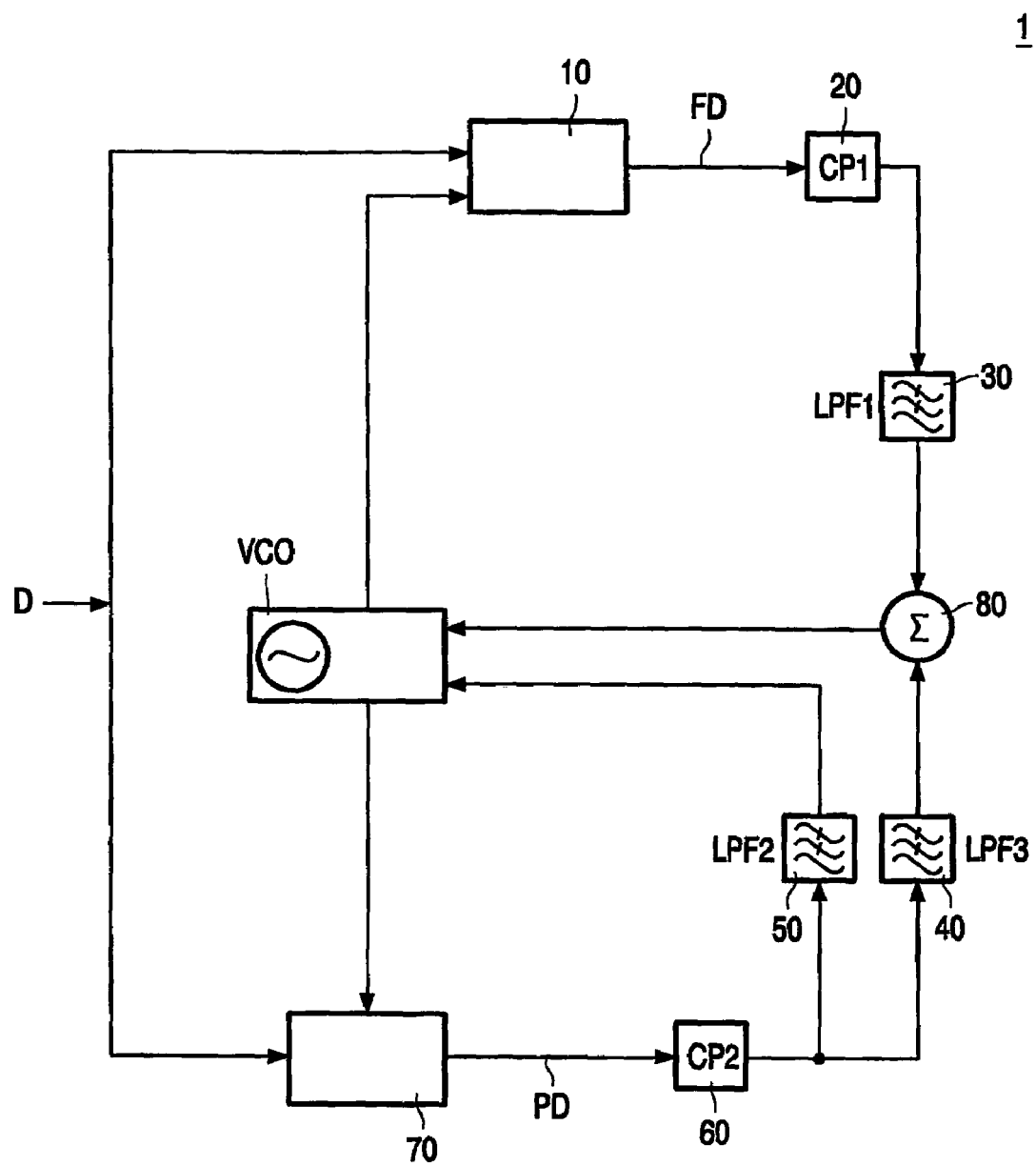

The above and other features and advantages of the invention will be apparent from the following description of the exemplary embodiments of the invention with reference to the accompanying drawings, in which:

FIG. 1 depicts a prior art quadricorrelator,

FIG. 2 depicts a schematic diagram of digital quadricorrelator according to the invention, FIG. 3 depicts rotating wheel analogy for mutually quadrature signals, FIG. 4 depicts frequency detection when the frequency of the mutually quadrature signals is lower than the bit rate of the incoming signal, FIG. 5 depicts frequency detection when the frequency of the mutually quadrature signals is higher than the bit rate of the incoming signal, and FIG. 6 depicts a PLL having a frequency detector as described in the present invention.

FIG. 2 depicts a schematic diagram of digital quadricorrelator according to the invention. The quadricorrelator 2 comprises double edge clocked bi-stable circuits 21, 22, 23, 24, 25, 26, 27, 28 coupled to multiplexers 31, 32, 33, 34 being controlled by a signal having the same bit rate as the incoming signal D. A first pair of double edge clocked bi-stable 21, 22 coupled to a first multiplexer 31 and a second pair of double edge clocked bi-stable 23, 24 coupled to a second multiplexer 32 are supplied by mutually quadrature phase shifted signals CKI and CKQ respectively and providing a first signal Q and a second signal I indicative for a phase difference between the incoming signal D and mutually quadrature phase shifted signals CKI, CKQ. It could be pointed out here that the bi-stable circuits could be flip-flops or latches. For the purpose of illustration in FIG. 2 is shown an implementation using D-type latches. The mutually quadrature signals are generated by a voltage controlled oscillator VCO, shown in FIG. 6.

A third pair of double edge clock bi-stable 25, 26 coupled to a third multiplexer 33 and a fourth pair of double edge clock bi-stable 27, 28 coupled to a fourth multiplexer 34 are supplied by the first signal Q and the second signal I, respectively. The quadricorrelator 2 further comprises a first adder 35 for adding a third signal provided by the third multiplexer 33 to a fourth signal provided by a fourth multiplexer 34 and generating an error signal FD indicative for a frequency difference between the incoming signal D and mutually quadrature signals CK, CKQ.

The combination latch-multiplexer performs as a latch clocked on both transitions of the incoming signal D. The incoming signal D transitions are sampled by the two quadrature signals CKI and CKQ at Tbit rate. The outputs of the multiplexers are updated only on the incoming signal D transitions keeping the same error at the output between transitions. The second output signal Q is the output of the phase detector and the first of the output signals I is in quadrature with Q. The phase difference between the incoming signal D and the mutually quadrature phase shifted signals CKI and CKQ, respectively, is transformed in a positive or negative quantified signal. When this signal is positive the clock increases its phase and for negative signals, the clock decreases its phase. The third and fourth pairs of latches 25, 26, 27, 28 are sampled on the transitions of I and Q signals. It is observed a sign inversion of the outputs of the latches sampling I and Q outputs on positive values of Q and I respectively. The inversion is needed to duplicate the working principle of a differentiator, which gives positive values on the rising edge and negative values on the falling edge of a signal. An alternative version of the quadricorrelator without inversion produces a frequency error too but the gain of the frequency detector decreases accordingly (only one transition is used for comparison).

The equilibrium position for the signals I and Q can be represented with the rotating wheel analogy as shown in FIG. 3. When it is a phase lock, the vector I is positive, stable and equal with +1 and the Q vector bounces from the positive to the negative quadrant in a periodic fashion. Frequency error generation signal for the frequency detector is explained with the aid of FIG. 4 and FIG. 5.

When the clock is too slow (FIG. 4), the pair of the two quadrature signals I and Q rotate counter-clockwise with an angular frequency equal to the frequency difference $\Delta\omega$ and the derivative of the signal I falling on top of Q signal generating an error signal.

When the clock is too fast (FIG. 5), the pair of the two quadrature signals I and Q rotate clockwise with an angular frequency equal to the frequency difference $\Delta\omega$ and the derivative of the signal I falling in top of signal Q with 180° phase difference signal generating an error signal.

FIG. 6 depicts a PLL having a frequency detector 10 as described in the present invention. The error signal FD is inputted to a coarse control input C of the voltage controlled oscillator VCO via a first charge pump 20 coupled to a first low-pass filter 30 coupled to a second adder 80. The frequency error signal FD is inputted to the coarse input C of the VCO because the VCO has to adapt as quickly as possible to frequency differences between the incoming signal D and the quadrature signals CKI and CKQ. A fine control input F of the VCO is controlled by a signal PD provided by a phase detector 70 coupled to a second charge pump 60 coupled to second low-pass filter 50.

The frequency error signal FD is, as it was shown in previous description, a quantified signal which, in phase-lock generates extra ripple on the coarse input of the VCO. However, using a tristate charge-pump as the first charge pump can alleviate this.

In the above description there were used single ended signals but a skilled person in the art could easily derive practical implementation of the quadricorrelator using differential signals.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claim is:

1. A Phase Locked Loop comprising a frequency detector including a balanced quadricorrelator, the balanced quadricorrelator comprising:

a first pair of double edge clocked bi-stable circuits coupled to a first multiplexer, the first pair of double edge clocked bi-stable circuits to provide a first signal;

a second pair of double edge clocked bi-stable circuits coupled to a second multiplexer, the second pair of double edge clocked bi-stable circuits supplied by the mutually quadrature phase shifted signals to provide a second signal, wherein the first and the second multiplexers are controlled by a control signal having the same bit-rate as the incoming signal;

a third pair of double edge clock bi-stable circuits coupled to a third multiplexer supplied by the first signal;

a fourth pair of double edge clock bi-stable circuits coupled to a fourth multiplexer supplied by the second signal; and wherein the first and second pair of double edge clocked bi-stable circuits are supplied by mutually quadrature phase shifted signals respectively to provide the first signal and the second signal, wherein the first and second signals are indicative for a phase difference between the incoming signal and mutually quadrature phase shifted signals.

2. A Phase Locked Loop as claimed in claim 1, wherein the mutually quadrature phase shifted signals are generated by a voltage controlled oscillator.

3. A Phase Locked Loop as claimed in claim 1, wherein the quadricorrelator further comprises a first adder for adding a third signal provided by the third multiplexer to a fourth signal provided by a fourth multiplexer and generating an error signal indicative for a frequency difference between the incoming signal and mutually quadrature signals.

4. A Phase Locked Loop as claimed in claim 3, wherein the error signal is inputted to a coarse control input of the voltage controlled oscillator via a first charge pump coupled to a first low-pass filter coupled to a second adder.

5. A Phase Locked Loop as claimed in claim 4, wherein a fine control input is controlled by a signal provided by a phase detector coupled to a second charge pump coupled to second low-pass filter.

* * * * *